(12) United States Patent
Kashiura et al.

(10) Patent No.: US 7,075,051 B2
(45) Date of Patent: Jul. 11, 2006

(54) PHOTOSENSOR DEVICE AND PORTABLE TERMINAL UNIT HAVING SEMICONDUCTOR PHOTOSENSOR DEVICE

(75) Inventors: Yukiko Kashiura, Kanagawa (JP); Hiroshi Suzunaga, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 182 days.

(21) Appl. No.: 10/696,001

(22) Filed: Oct. 30, 2003

(65) Prior Publication Data

US 2005/0051704 A1     Mar. 10, 2005

(30) Foreign Application Priority Data

Sep. 4, 2003   (JP)   ............................. 2003-312853

(51) Int. Cl.
*H03F 3/08*    (2006.01)
*G01J 1/44*    (2006.01)
*H01J 40/14*   (2006.01)

(52) U.S. Cl. ............................. 250/214 A; 250/214 R; 330/308; 327/514

(58) Field of Classification Search ............ 250/214 A, 250/214 LA, 214.1, 214 R; 327/514; 330/308
See application file for complete search history.

(56) References Cited

U.S. PATENT DOCUMENTS 6,348,682 B1 *   2/2002   Lee ......................... 250/214 A
6,455,839 B1 *   9/2002   O'Connor et al. .......... 250/221

FOREIGN PATENT DOCUMENTS

| JP | 2-165709 | 6/1990 |
|---|---|---|
| JP | 5-215602 | 8/1993 |
| JP | 8-18348 | 1/1996 |
| JP | 8-129046 | 5/1996 |
| JP | 9-247355 | 9/1997 |
| JP | 2002-217448 | 8/2002 |
| JP | 2003-125060 | 4/2003 |
| WO | WO 02/073956 A1 | 9/2002 |

* cited by examiner

*Primary Examiner*—Stephone B. Allen
*Assistant Examiner*—Suezu Ellis
(74) *Attorney, Agent, or Firm*—Oblon, Spivak, McClelland, Maier & Neustadt, P.C.

(57) ABSTRACT

A semiconductor photosensor device which outputs a detection result when a trigger signal is inputted, comprises: a photodiode current arithmetic circuit which is in an operating state regardless of whether before or after the input of the trigger signal, and which outputs a photocurrent generated by light irradiation; a first amplifier which is in an operating state regardless of whether before or after the input of the trigger signal, and which amplifier and outputs the output of the photodiode current arithmetic circuit; and a second amplifier which is in a non-operating state before the input of the trigger signal, wherein the second amplifier shifts to an operating state upon receiving the trigger signal, and amplifies and outputs the output of the first amplifier.

23 Claims, 14 Drawing Sheets

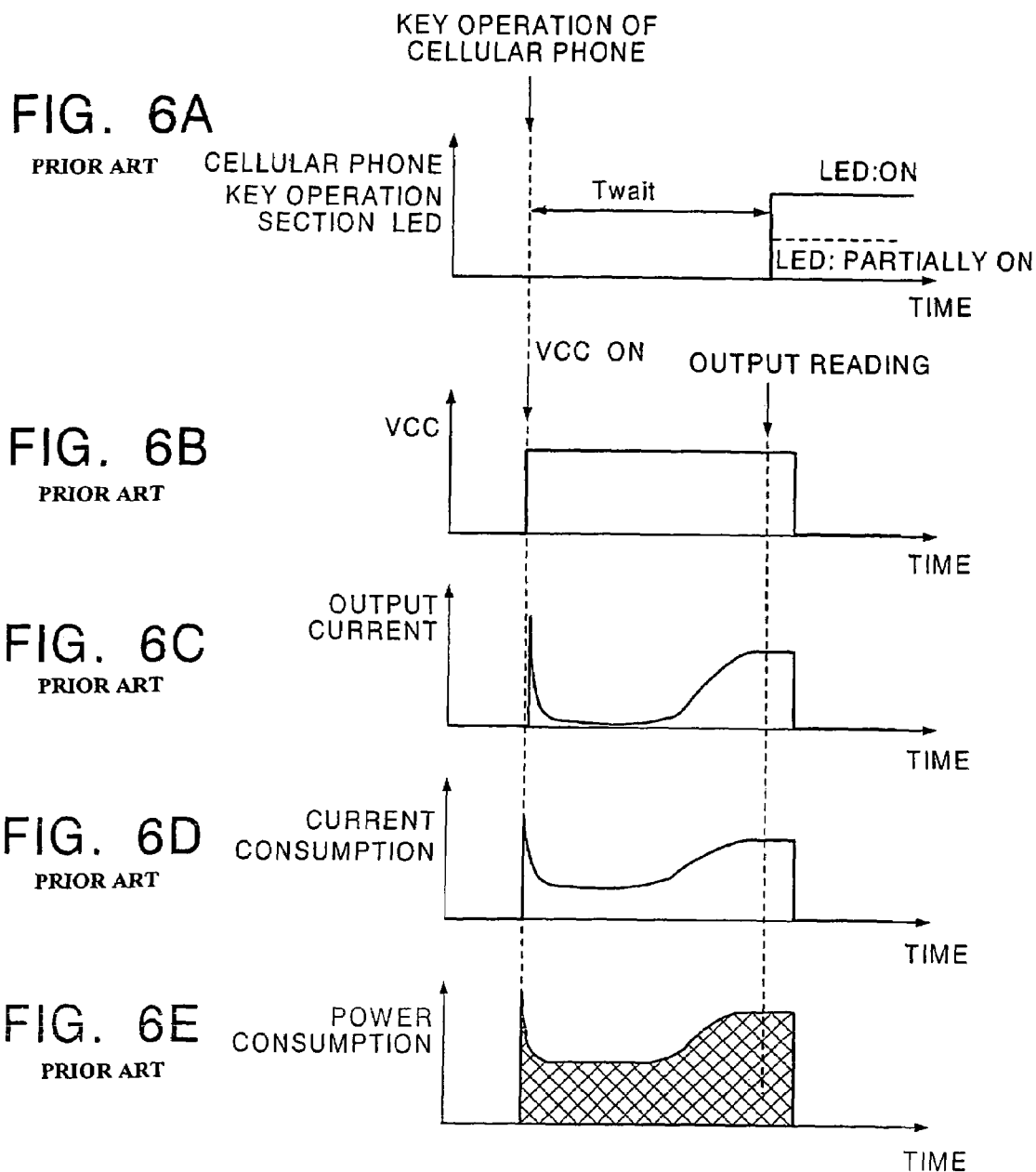

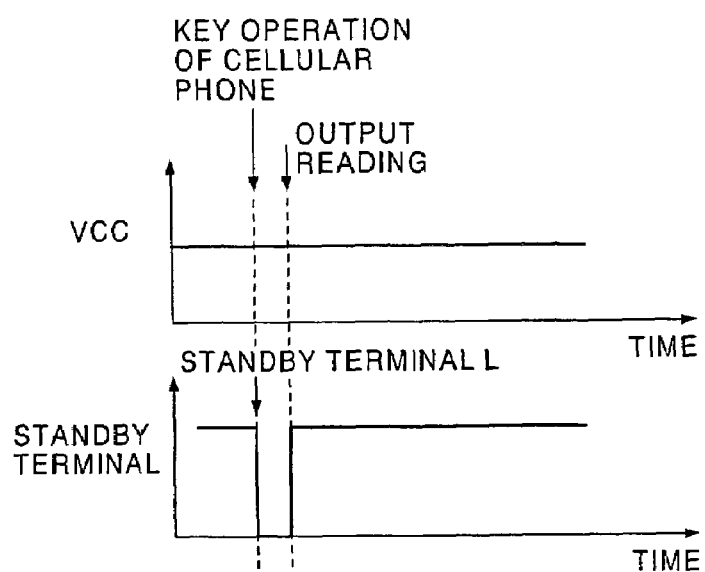
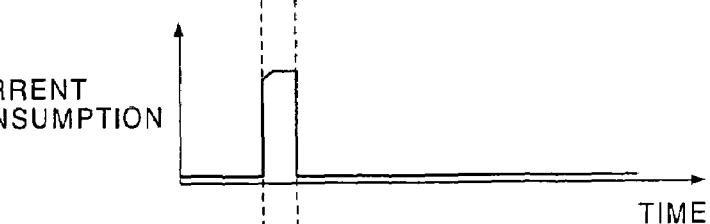
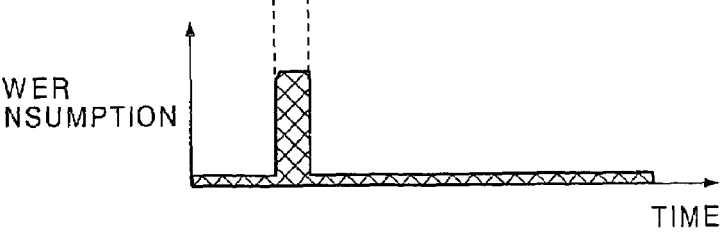
FIG.14A VCC
FIG.14B STANDBY TERMINAL
FIG.14C OUTPUT CURRENT
FIG.14D CURRENT CONSUMPTION
FIG.14E POWER CONSUMPTION

PHOTOSENSOR DEVICE AND PORTABLE TERMINAL UNIT HAVING SEMICONDUCTOR PHOTOSENSOR DEVICE

CROSS REFERENCE TO RELATED APPLICATION

This application claims benefit of priority under 35 U.S.C. §119 to Japanese Patent Application No. 2003-312853, filed on Sep. 4, 2003, the entire contents of which are incorporated by reference herein.

BACKGROUND OF THE INVENTION

1. Field of the Invention

The present invention relates to a semiconductor photosensor device and a portable terminal unit, and particularly relates to a semiconductor photosensor device which realizes an improvement in responsibility in a shift from a standby state to an operating state as well as a reduction in power consumption, and a portable terminal unit using the semiconductor photosensor device.

2. Description of the Related Art

A semiconductor photosensor device is a photosensor which provides a linear output according to its ambient illumination (lightness), and mainly in a portable terminal unit, it is used for the ON/OFF control of a liquid crystal backlight and an LED provided in a key operation section according to the ambient illumination (lightness). It is used as a sensor which reduces unnecessary power consumption, for example, by turning off the backlight and the LED of the key operation section when its surroundings are light, and when its surroundings are dark, turning them on, or turning them on after brightness is adjusted.

In the portable terminal unit, for example, as shown in FIG. 1, an output of the semiconductor photosensor device is read in predetermined timing, for example, when a key operation is performed, and the brightness of the backlight and the LED is adjusted according to the output of the semiconductor photosensor device.

Specifically, in the example in FIG. 1, when no key operation is performed (step S10: No), the current states of the backlight and the LED of the key operation section are maintained (step S12). On the other hand, when a key operation is performed (step S10: Yes), the output of the semiconductor photosensor device is read (step S14). When the output of the semiconductor photosensor device is low (step S16), the LED of the key operation section is turned on, and the backlight is also turned on (step S18). When the output of the semiconductor photosensor device is medium (step S20), the LED of the key operation section is turned off, but the backlight is turned on (step S22). When the output of the semiconductor photosensor device is high (step S24), the LED of the key operation section is turned off, and the backlight is also turned off (step S26).

FIG. 2 is a block diagram showing the circuit configuration of a related semiconductor photosensor device. As shown in FIG. 2, the related semiconductor photosensor device includes a photodiode current arithmetic circuit 10 connected between a power supply terminal VCC and a ground terminal GND and plural current amplifiers 12, 14, and 16 connected in series. An output of the photodiode current arithmetic circuit 10 is amplified by the series-connected current amplifiers 12, 14, and 16, and outputted as an output current from an output terminal OUT.

FIG. 3 is a diagram showing an example of the concrete circuit configuration of the photodiode current arithmetic circuit 10, and FIG. 4 is a diagram showing the cross-sectional structure of photodiodes PD1 and PD2 in FIG. 3. The photodiode current arithmetic circuit 10 such as shown in FIG. 3 and FIG. 4 is disclosed, for example, in Japanese Patent Laid-open No. 2002-217448. As shown in FIG. 3, the photodiode current arithmetic circuit 10 includes transistors Q1 to Q4 in addition to the photodiodes PD1 and PD2. An n-times current mirror circuit includes the transistors Q1 and Q2, and an m-times current mirror circuit includes the transistors Q3 and Q4.

As shown in FIG. 4, cathode electrodes of the photodiodes PD1 and PD2 are formed by a common N-type semiconductor region. The anode side of the photodiode PD2 is connected to the ground GND via a P-type semiconductor region, and the anode side of the photodiode PD1 is connected to an anode electrode via a P-type semiconductor region.

FIG. 5A to FIG. 5E are diagrams showing operation waveforms of the semiconductor photosensor device shown in FIG. 2. As shown in FIG. 5B, in the related art, the voltage is constantly supplied to the power supply terminal VCC. Therefore, as shown in FIG. 5C, the output current from the output terminal OUT also flows constantly, and hence, as shown in FIG. 5D and FIG. 5E, both current consumption and power consumption are constant.

If the key operation of the portable terminal unit is performed in predetermined timing as shown in FIG. 5A, the output current of the semiconductor photosensor device is read after a predetermined period of time from when the key operation is operated, and based on the result of this reading, the LED of the key operation section is turned on and/or the backlight is turned on.

However, in such a semiconductor photosensor device, a power supply voltage is constantly supplied to the power supply terminal VCC, whereby if the photodiode current arithmetic circuit 10 is exposed to light, a current corresponding to the light is always outputted. Therefore, electric power is consumed even during a period when light illumination need not be detected by the semiconductor photosensor device.

To avoid the above situation, in the related art, when the semiconductor photosensor device is used, as shown in FIG. 6A to FIG. 6E, the supply of the power supply voltage to the power supply terminal VCC is constantly stopped, and at a point in time when the key operation of the portable terminal unit is performed, the supply of the power supply voltage to the power supply terminal VCC is started. Then, after the output current is read after a predetermined period of time, the supply of the power supply voltage to the power supply terminal VCC is stopped. In so doing, when the key operation is performed, the illumination of the portable terminal unit can be detected, and in addition, a reduction in power consumption can be realized.

However, if the power supply voltage is supplied to the power supply terminal VCC in such a manner as shown in FIG. 6A to FIG. 6E, a current flows to the photodiode current arithmetic circuit 10 and the first stage current amplifier 12 after the supply of the power supply voltage to the power supply terminal VCC is started, and hence charge and discharge of parasitic capacitances of respective elements of the photodiode current arithmetic circuit 10 and the current amplifier 12 are performed by this current. In this semiconductor photosensor device, charging/discharging currents of these parasitic capacitances are supplied by a photocurrent flowing to the photodiodes PD1 and PD2 in FIG. 3.

This photocurrent is a minute current of about several nanoamperes (nA) at an illumination of about 100 lux, whereby the charge and discharge of the respective parasitic capacitances require a lot of time. Moreover, in this semiconductor photosensor device, the photocurrent changes according to illumination, whereby the lower the illumination, the smaller the photocurrent becomes, and consequently, the charge and discharge of the respective parasitic capacitances require more time.

Hence, there is a problem that a time Twait from when the key operation is performed until the output current of the semiconductor photosensor device is read is as long as several tens of milliseconds to 100 milliseconds. Moreover, there is a problem that a user has to use the portable terminal unit during this time without the brightness adjustment of the LED of the key operation section and the backlight of the portable terminal unit, for example, in a state in which the picture is hard to see. Therefore, there is a strong demand for a reduction in the time from the instant of the key operation or the like until the output current of the semiconductor photosensor device is read as well as a reduction in power consumption.

SUMMARY OF THE INVENTION

In order to accomplish the aforementioned and other objects, according to one aspect of the present invention, a semiconductor photosensor device which outputs a detection result when a trigger signal is inputted, comprises:
  a photodiode current arithmetic circuit which is in an operating state regardless of whether before or after the input of the trigger signal, and which outputs a photocurrent generated by light irradiation;
  a first amplifier which is in an operating state regardless of whether before or after the input of the trigger signal, and which amplifies and outputs the output of the photodiode current arithmetic circuit; and
  a second amplifier which is in a non-operating state before the input of the trigger signal, wherein the second amplifier shifts to an operating state upon receiving the trigger signal, and amplifies and outputs the output of the first amplifier.

According to another aspect of the present invention, a portable terminal unit, comprises:
  a trigger generator which generates a trigger signal based on an operation from outside; and
  a semiconductor photosensor device which outputs a detection result when the trigger signal is inputted, wherein
  the semiconductor photosensor device comprises:
  a photodiode current arithmetic circuit which is in an operating state regardless of whether before or after the input of the trigger signal, and which outputs a photocurrent generated by light irradiation;
  a first amplifier which is in an operating state regardless of whether before or after the input of the trigger signal, and which amplifies and outputs the output of the photodiode current arithmetic circuit; and
  a second amplifier which shifts to an operating state upon receiving the trigger signal, and which amplifies and outputs the output of the first amplifier.

BRIEF DESCRIPTION OF THE DRAWINGS

FIG. 6A to FIG. 6E are diagrams each showing another operation waveform of the semiconductor photosensor device shown in FIG. 2;

FIG. 14A to FIG. 14E are diagrams showing operation waveforms of the semiconductor photosensor device in FIG. 13.

DETAILED DESCRIPTION OF THE EMBODIMENTS

[First Embodiment]
In a semiconductor photosensor device according to the first embodiment, in a standby state, only a photodiode current arithmetic circuit and a first stage current amplifier are operated by supplying a power supply voltage thereto, and second and subsequent stage current amplifiers are not operated. In a shift from the standby state to an operating state caused by an operation which becomes a trigger such as a key operation, the second and subsequent stage current amplifiers are operated by supplying a power supply voltage thereto, which results in a reduction in power consumption as well as a reduction in time required from the operation as the trigger until an output current of the semiconductor photosensor device is stabilized. Further details will be given below.

Figure 7:
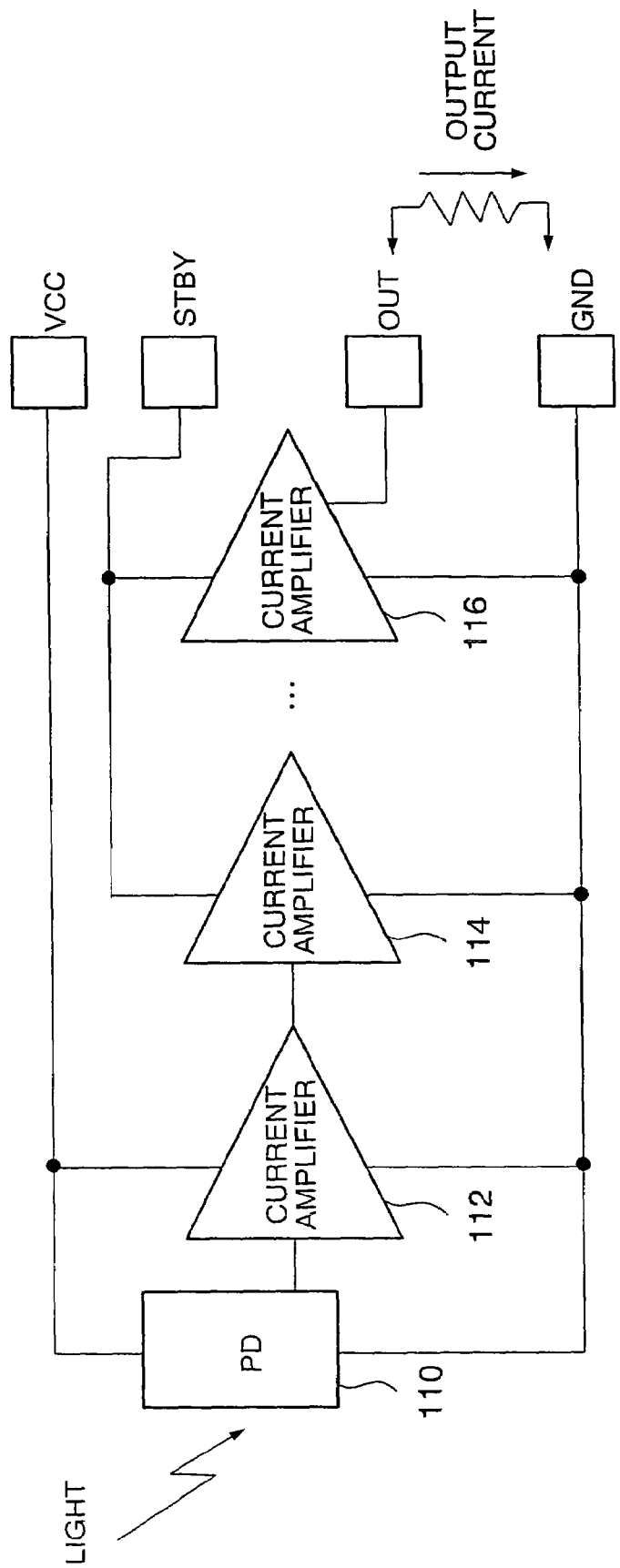
FIG. 7 is a diagram showing an example of the configuration of a semiconductor photosensor device according to a first embodiment.

FIG. 7 is a block diagram showing the configuration of the semiconductor photosensor device according to this embodiment. As shown in FIG. 7, the semiconductor photosensor device according to this embodiment includes a photodiode current arithmetic circuit 110, a first stage current amplifier 112, and second and subsequent stage current amplifiers 114 and 116. In this embodiment, the number of the second and subsequent stage current amplifiers is optional.

The photodiode current arithmetic circuit 110 and the first stage current amplifier 112 are connected to a power supply terminal VCC, and supplied with a power supply voltage from this power supply terminal VCC. On the other hand, the second and subsequent current amplifiers 114 and 116 are connected to a standby terminal STBY, and supplied with a power supply voltage from this standby terminal STBY. Namely, in this embodiment, a power supply line to the photodiode current arithmetic circuit 110 and the first stage current amplifier 112 and a power supply line to the second and subsequent current amplifiers 114 and 116 are independent. All of these photodiode current arithmetic circuit 110 and the current amplifiers 112, 114, and 116 are connected to a ground terminal GND.

An output of the photodiode current arithmetic circuit 110 is inputted to the first stage current amplifier 112. An output of the first stage current amplifier 112 is inputted to the second stage current amplifier 114. The respective current amplifiers are connected in series in this manner, and an output of the last stage current amplifier 116 is connected to an output terminal OUT. A current which flows from this output terminal OUT is an output current of this semiconductor photosensor device.

Figure 3:
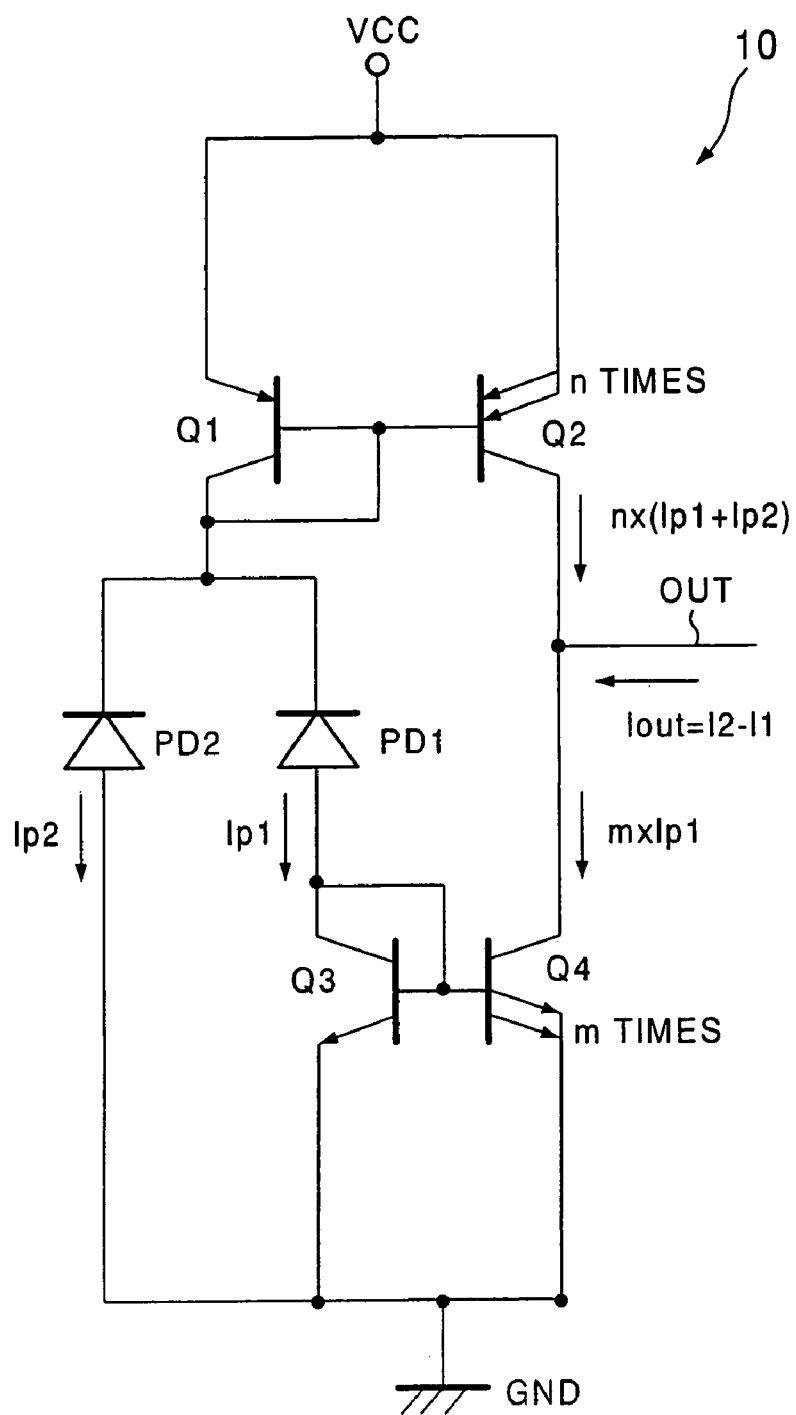
FIG. 3 is a diagram showing the concrete configuration of a photodiode current arithmetic circuit in FIG. 2.
Figure 4:
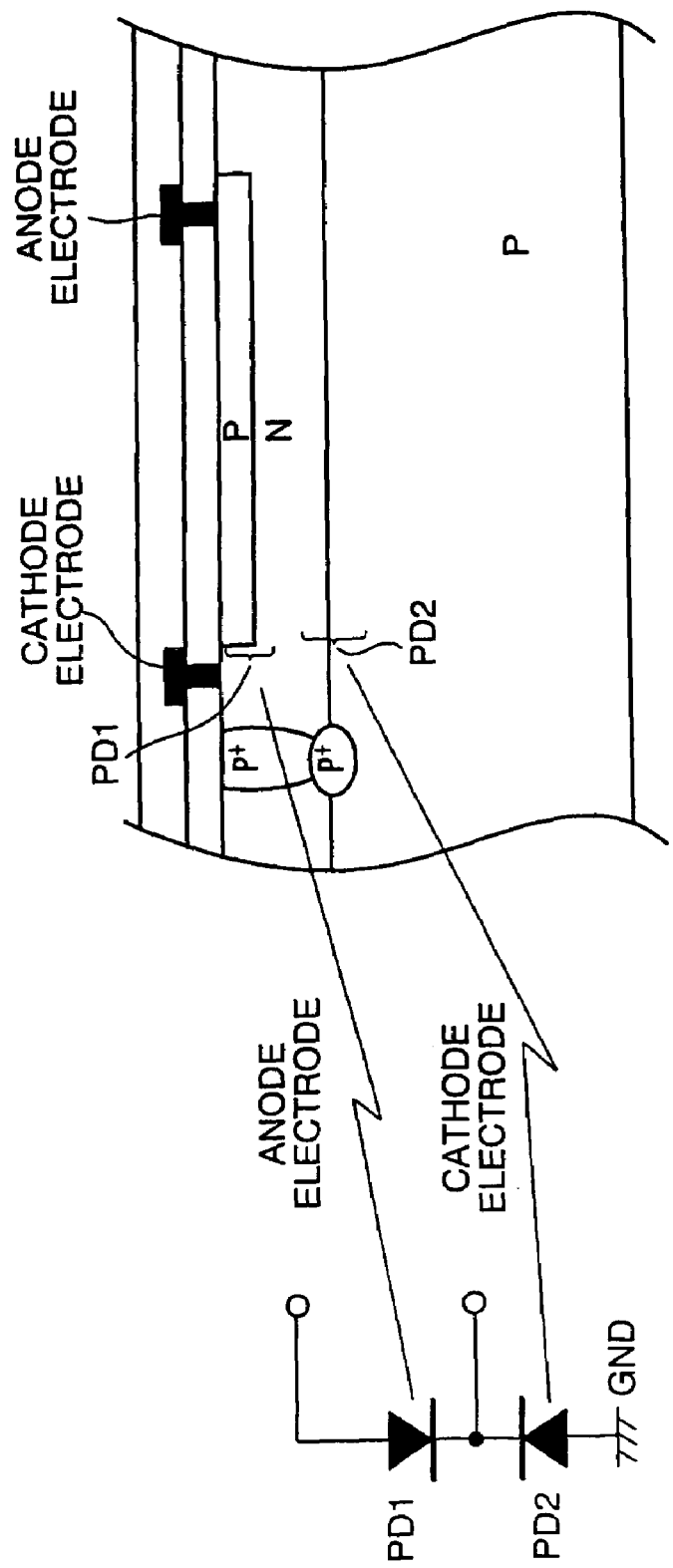
FIG. 4 is a sectional view showing the semiconductor structure of two photodiodes in FIG. 3.
Figure 5A:
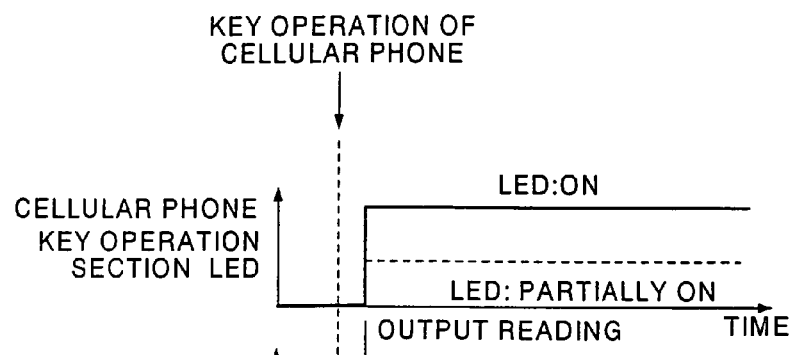
FIG. 5A to FIG. 5E are diagrams showing operation waveforms of the semiconductor photosensor device shown in FIG. 2.
Figure 5B:
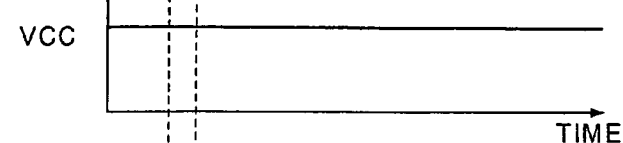
Figure 5C:
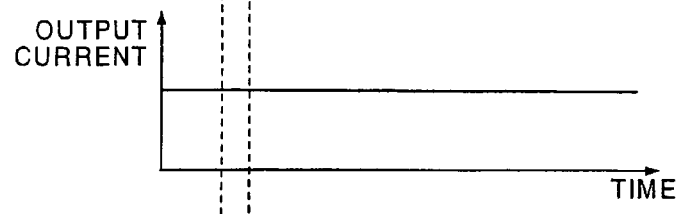
Figure 5D:
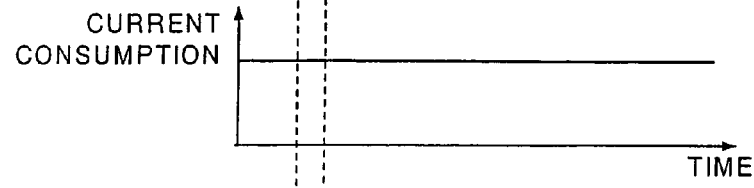
Figure 5E:
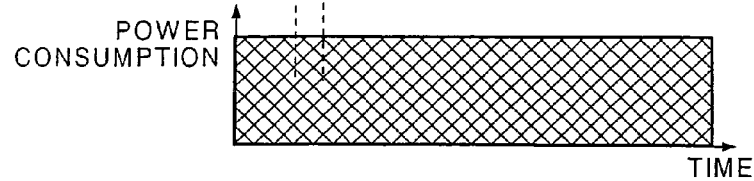

The configuration of the photodiode current arithmetic circuit 110 is the same as that in FIG. 3 described above. Accordingly, in the photodiode current arithmetic circuit 110, a photocurrent, which is approximately proportional to inputted light irradiation, is generated and inputted to the first stage current amplifier 112. This photocurrent is sequentially amplifier by the current amplifier 112, the current amplifier 114, and the current amplifier 116, and outputted as the output current from the output terminal OUT.

Figure 8A:
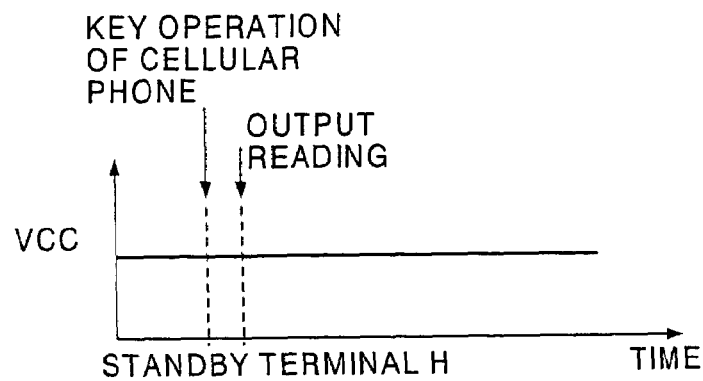
FIG. 8A to FIG. 8E are diagrams showing operation waveforms of the semiconductor photosensor device in FIG. 7.
Figure 8B:
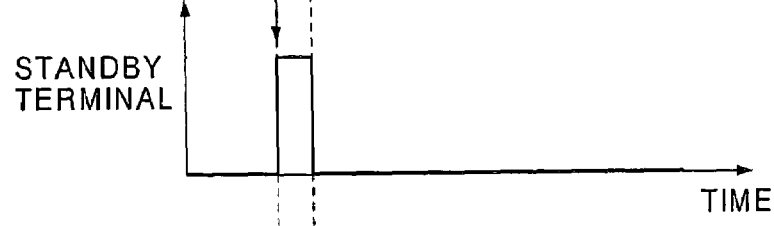
Figure 8C:
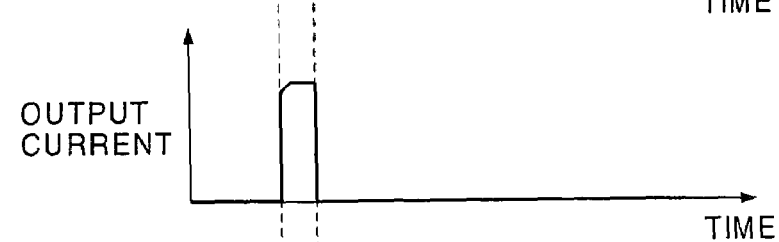

FIG. 8A to FIG. 8E are diagrams showing operation waveforms of the semiconductor photosensor device shown in FIG. 7. As shown in FIG. 8A, the power supply voltage is constantly supplied to the power supply terminal VCC, but as shown in FIG. 8B, the power supply voltage is not supplied to the standby terminal STBY when a portable terminal unit is in a standby state. Here, in this embodiment, the standby state can be defined as a state in which the portable terminal unit is powered on but neither key operation nor phone call is performed.

When the key operation of the portable terminal unit is performed, and thereby the portable terminal unit shifts from the standby state to an operating state, the power supply voltage is supplied to the standby terminal STBY. Here, in this embodiment, the operating state can be defined as a state in which a user is performing the key operation of the portable terminal unit or making a phone call.

Then, after a predetermined period of time, the output current from the semiconductor photosensor device is read (See FIG. 8C), and the supply of the power supply voltage to the standby terminal STBY is stopped again. Namely, the power supply voltage is supplied to the standby terminal STBY from outside the semiconductor photosensor device only for the predetermined period of time after the performance of the key operation of the portable terminal unit.

Figure 8D:
Figure 8E:
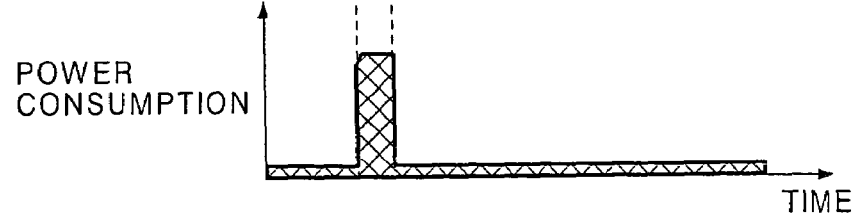

In the standby state, the power supply voltage is supplied to the photodiode current arithmetic circuit 110 and the first stage current amplifier 112, but no power supply voltage is supplied to the second and subsequent stage current amplifiers 114 and 116. Hence, as shown in FIG. 8D and FIG. 8E, current consumption and power consumption are kept low. However, the power supply voltage is supplied to the photodiode current arithmetic circuit 110 and the first stage current amplifier 112 from the standby state, whereby these photodiode current arithmetic circuit 110 and the current amplifier 112 are in the operating state, and hence parasitic capacitances of their respective elements are being charged/discharged.

A trigger signal is generated based on an operation which becomes a trigger such as the key operation of the portable terminal unit, and at a point in time when the necessity for the reading of the output current of the photodiode current arithmetic circuit 110 arises, the power supply voltage is also supplied to the second and subsequent current amplifiers 114 and 116. At this time, a predetermined voltage is already supplied to capacitances of the photodiodes PD1 and PD2 of the photodiode current arithmetic circuit 110, and the predetermined voltage is also supplied to the respective parasitic capacitances of the current amplifier 112, whereby no transient change in current occurs in the respective parasitic capacitances in the photodiode current arithmetic circuit 110 and the current amplifier 112. Consequently, no charge/discharge time of the respective parasitic capacitances of the photodiode current arithmetic circuit 110 and the current amplifier 112 occurs, which results in a great reduction in the time required until the output current of the semiconductor photosensor device is stabilized even at low illumination.

More specifically, it is possible to shorten the time from when the operation as the trigger such as the key operation is performed until the output current of the semiconductor photosensor is read by one digit or more as compared with the related art. Hence, the waiting time of the user of the portable terminal unit from when the operation as the trigger is performed can be drastically reduced. Besides, the current consumption and power consumption of the semiconductor photosensor device in the standby state are very low, and consequently, a reduction in the power consumption of the semiconductor photosensor device can be also realized.

Figure 9:
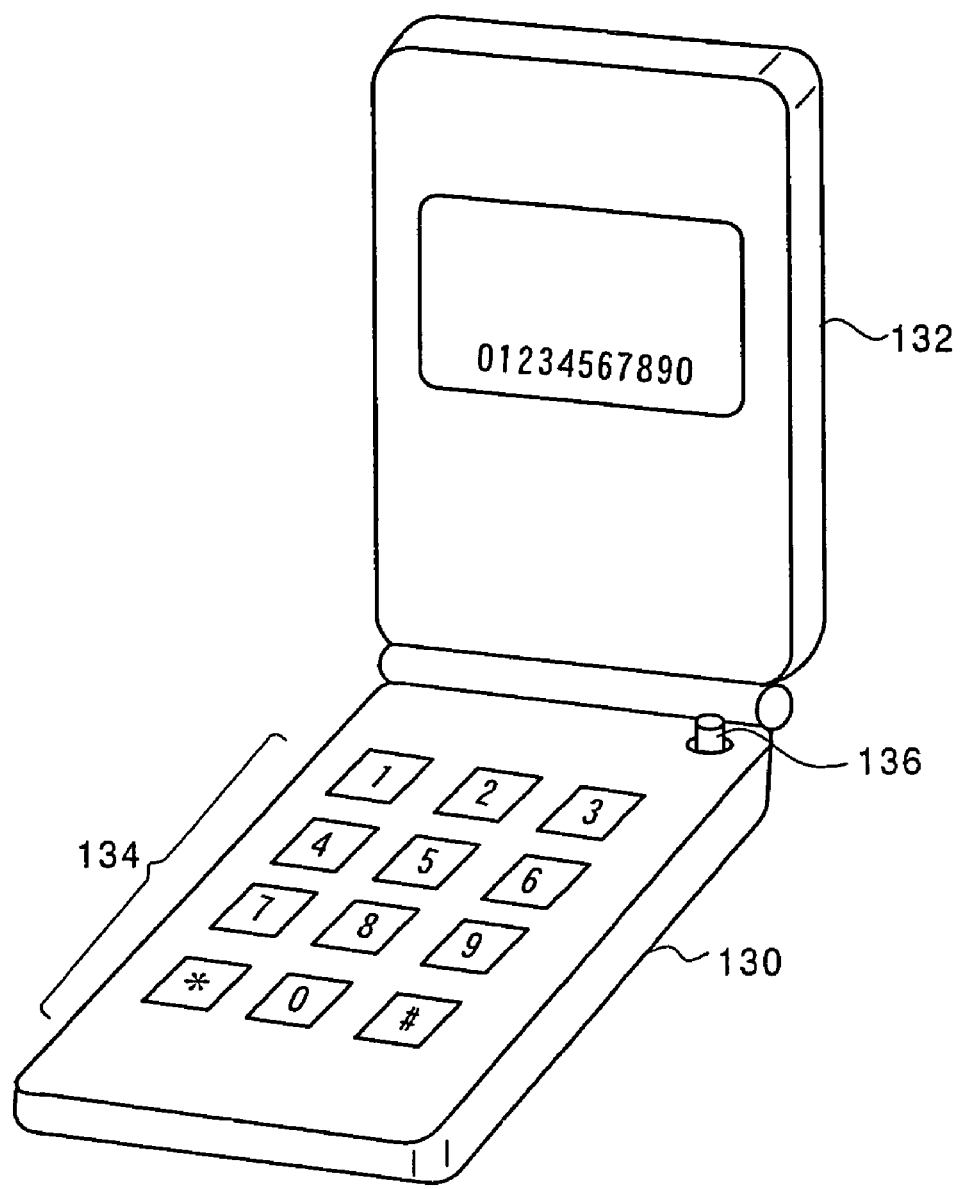
FIG. 9 is a perspective view showing an example of the structure of a portable terminal unit equipped with the semiconductor photosensor device in FIG. 7.

FIG. 9 is a general view of the portable terminal unit (cellular phone) according to this embodiment. The portable terminal unit shown in FIG. 9 contains the aforementioned semiconductor photosensor device.

Figure 1:
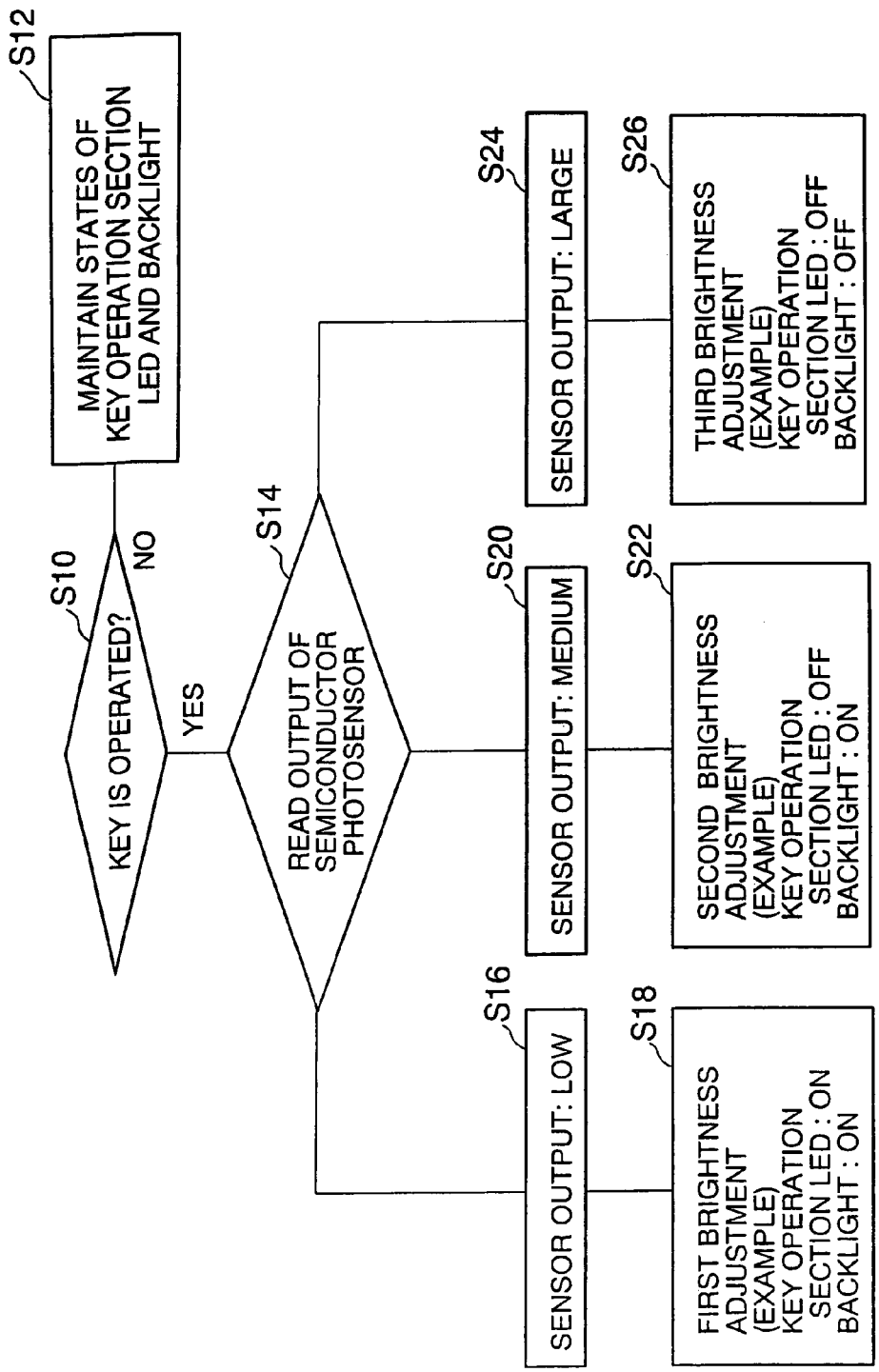
FIG. 1 is a diagram showing the control flow to control the on/off of an LED and a backlight of a portable terminal unit based on an output current of a semiconductor photosensor device.
Figure 2:
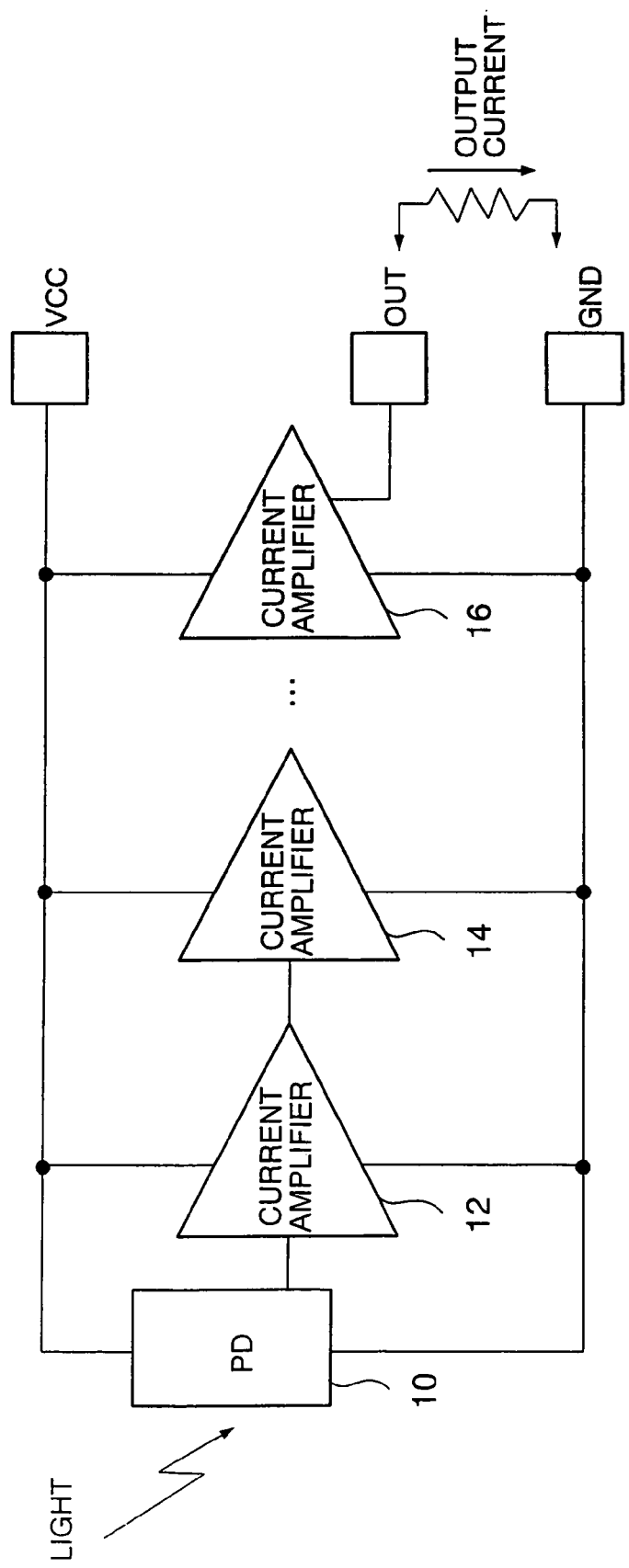
FIG. 2 is a circuit diagram showing the configuration of a related semiconductor photosensor device.

As shown in FIG. 9, the portable terminal unit according to this embodiment is formed by openably and closably connecting a main body 130 and a cover 132. The main body 130 is provided with a key operation section 134. The aforementioned trigger signal is generated by the user's operation of keys provided in the key operation section 134. An LED is embedded in the key operation section 134, and the brightness of the LED is adjusted according to the result of detection by the semiconductor photosensor device. For example, when an output of the detection result by the semiconductor photosensor device is low as shown in FIG. 1, the LED is turned on, but when the output is medium or high, the LED is not turned on.

Further, the portable terminal unit of this embodiment is provided with a projection 136 for detecting an open or closed state. The projection 136 is resiliently biased upward in FIG. 9. This projection 136 is pushed downward when the cover 132 is closed, whereas the projection 136 protrudes upward when the cover 132 is opened. Thus, the portable terminal unit is structured so that the open or closed state of the cover 132 can be detected by the projection 136. Accordingly, when a shift from the closed state to the open state of the cover 132 is detected by the projection 136, it is also possible to generate the trigger signal with this shift detection as an operation which becomes a trigger. This is because the opening of the cover 132 indicates that the key operation section 134 is brought into a state capable of being operated from outside by the user.

[Second Embodiment]

A semiconductor photosensor device according to the second embodiment is obtained by modifying the aforementioned first embodiment. A switching circuit 200 is inserted between the power supply terminal VCC and the second and subsequent stage current amplifiers 14 and 116, and a control signal which controls the on/off of this switching circuit 200 is inputted from the standby terminal STBY. Further details will be given below.

Figure 10:
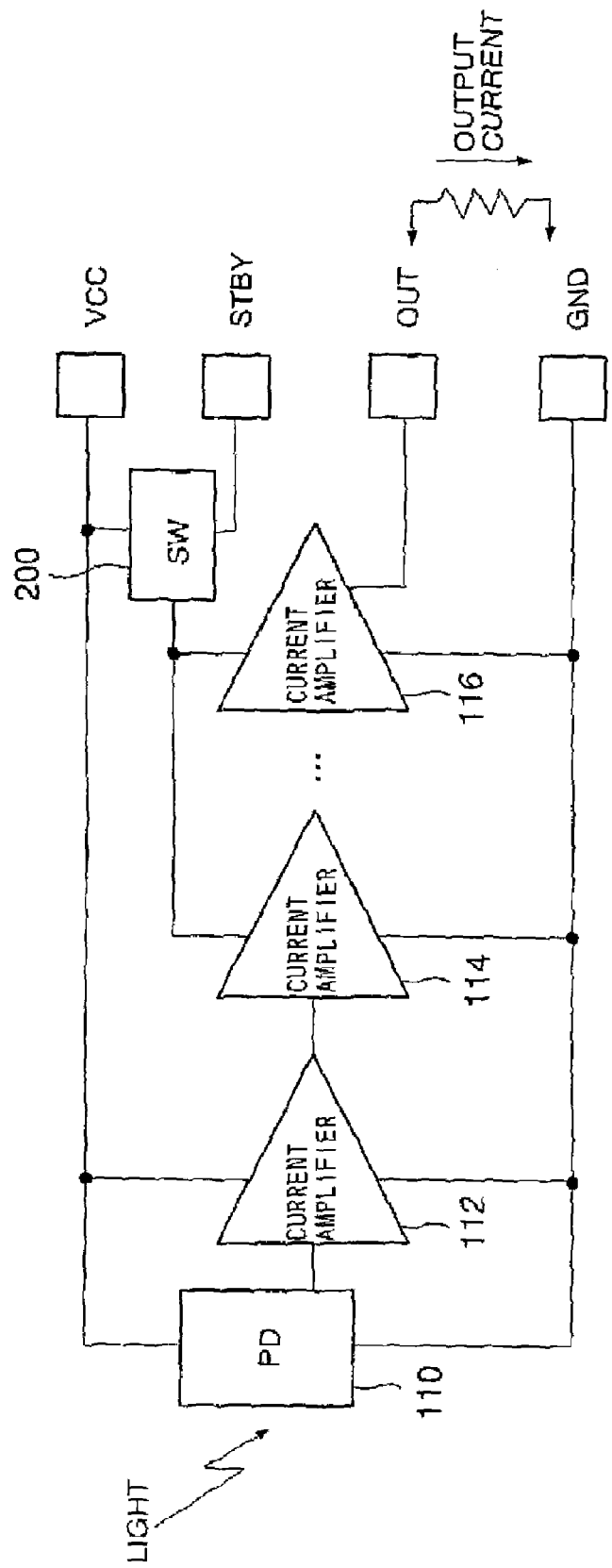
FIG. 10 is a diagram showing an example of the configuration of a semiconductor photosensor device according to a second embodiment.

FIG. 10 is a block diagram showing the configuration of the semiconductor photosensor device according to this embodiment. As shown in FIG. 10, in the semiconductor photosensor device according to this embodiment, the switching circuit 200 is inserted between the power supply terminal VCC and the second and subsequent stage current amplifiers 114 and 116. The control signal which controls the on/off of this switching circuit 200 is inputted from the standby terminal STBY.

Namely, the selection of whether or not to supply the power supply voltage supplied from the power supply terminal VCC to the second and subsequent stage current amplifiers 114 and 116 is made by the control signal inputted from the standby terminal STBY. More specifically, when the portable terminal unit is in the standby state, the switching circuit 200 is off, and no power supply voltage is supplied to the current amplifiers 114 and 116. However, when the portable terminal unit shifts from the standby state to the operating state, the switching circuit 200 is turned on only for a predetermined period of time, and the power supply voltage is supplied from the power supply terminal VCC to the current amplifiers 114 and 116 only for the predetermined period of time.

As in the aforementioned first embodiment, the power supply voltage is constantly supplied from the power supply terminal VCC to the photodiode current arithmetic circuit 110 and the first stage current amplifier 112. In other words, regardless of whether the portable terminal unit is in the standby state or the operating state, the power supply voltage is supplied to the photodiode current arithmetic circuit 110 and the current amplifier 112.

The aforementioned configuration of the semiconductor photosensor device makes it possible to realize the same operation as in the aforementioned first embodiment although the power supply system in the semiconductor photosensor device is one system.

[Third Embodiment]

A semiconductor photosensor device according to the third embodiment is obtained by modifying the aforementioned first embodiment. By using a current flowing into the standby terminal STBY as the output current of the semiconductor photosensor device, the number of terminals of the semiconductor photosensor device is reduced to three, that is, the power supply terminal VCC, the standby terminal STBY, and the ground terminal GND. Further details will be given below.

Figure 11:
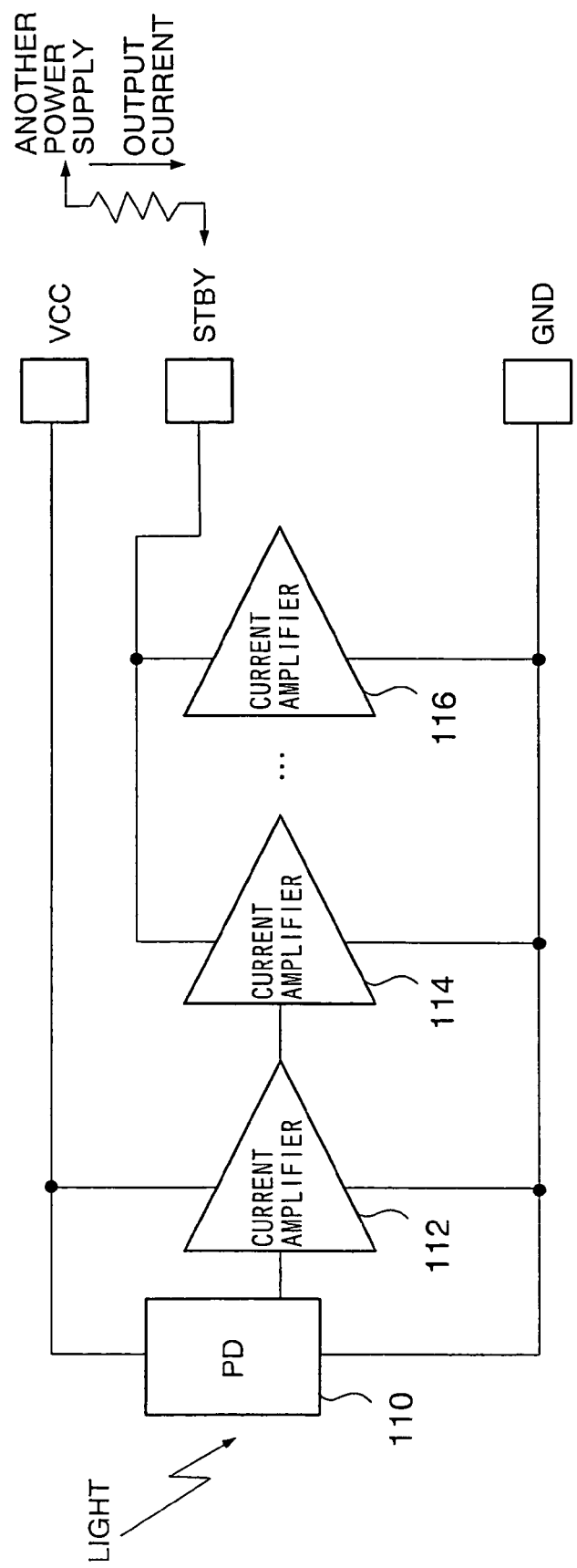
FIG. 11 is a diagram showing an example of the configuration of a semiconductor photosensor device according to a third embodiment.

FIG. 11 is a block diagram showing the configuration of the semiconductor photosensor device according to this embodiment. As shown in FIG. 11, in the semiconductor photosensor device according to this embodiment, the output terminal OUT is omitted from the semiconductor photosensor device in the aforementioned first embodiment. Namely, three terminals of the power supply terminal VCC, the standby terminal STBY, and the ground terminal GND are provided. The power supply voltage is constantly supplied to the power supply terminal VCC as shown in FIG. 8A, and as shown in FIG. 8B, the power supply voltage is supplied to the standby terminal STBY only for the predetermined period of time after the shift from the standby state to the operating state. In this embodiment, the current which flows from this power supply voltage (another power supply) to the standby terminal STBY becomes the output current.

Figure 12:
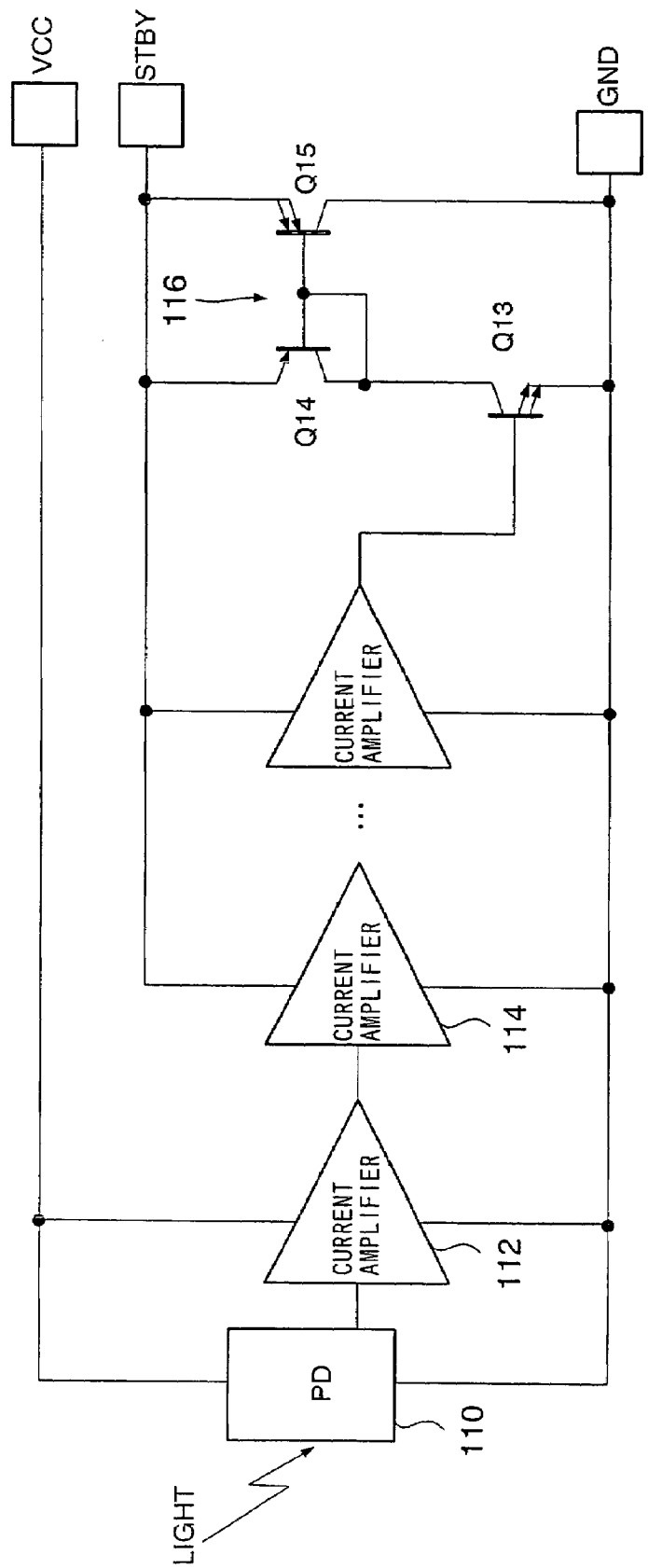
FIG. 12 is a circuit diagram explaining the concrete configuration of a portion corresponding to a last current amplifier in the semiconductor photosensor device in FIG. 11.

FIG. 12 is a diagram showing an example of the concrete circuit configuration of a portion corresponding to the last current amplifier 116 of the semiconductor photosensor device shown in FIG. 11. As shown in FIG. 12, the last current amplifier 116 is configured by a current mirror circuit including transistors Q14 and Q15. Namely, the current flowing through the transistors Q13 and Q14 is amplified by the current mirror circuit and then flows through the transistor Q15.

The aforementioned configuration of the semiconductor photosensor device makes it possible to form the semiconductor photosensor device with three terminals as in the prior art. Hence, the semiconductor photosensor device according to this embodiment can be used without making a large modification to a peripheral circuit hitherto used.

[Fourth Embodiment]

A semiconductor photosensor device according to the fourth embodiment is obtained by modifying the aforementioned first embodiment. By forming a ground terminal of the first stage current amplifier 112 and a ground terminal of the second and subsequent stage current amplifiers 114 and 116 independently from each other, the first stage current amplifier 112 operates constantly, and the second and subsequent stage current amplifiers 114 and 116 operate only for the predetermined period of time after the shift from the standby state to the operating state. Further details will be given below.

Figure 13:
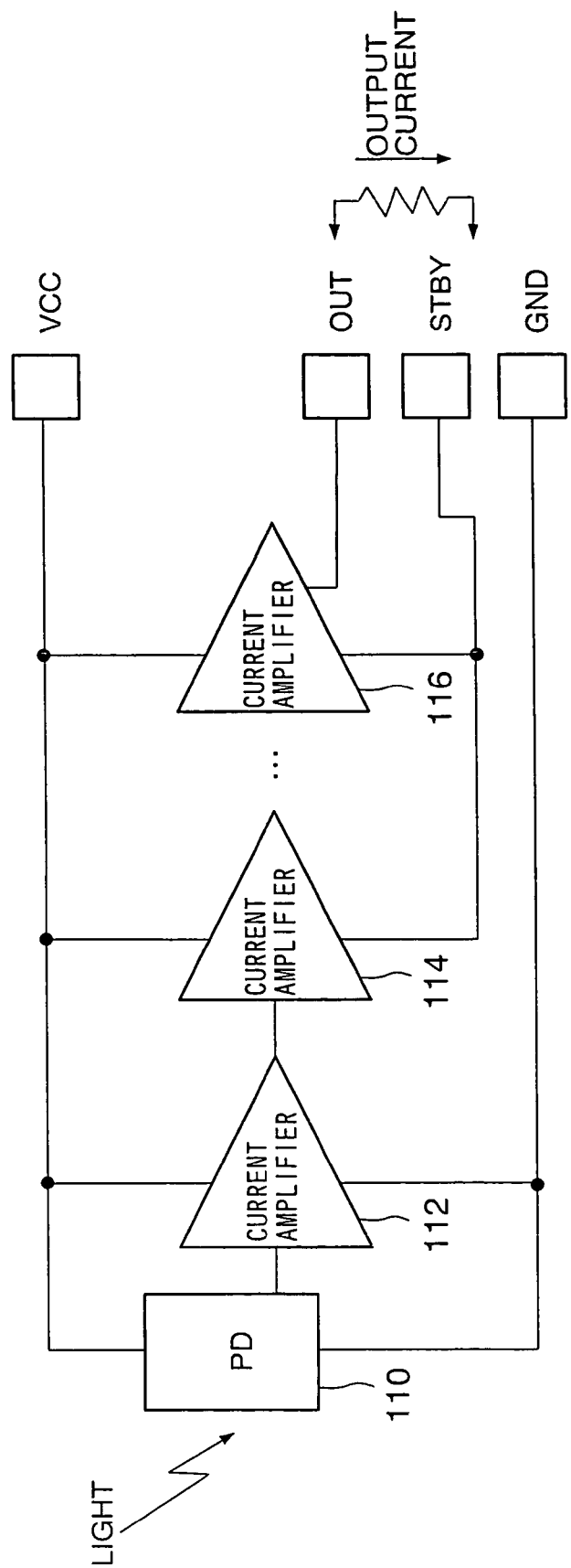
FIG. 13 is a diagram showing an example of the configuration of a semiconductor photosensor device according to a fourth embodiment.

FIG. 13 is a block diagram showing the configuration of the semiconductor photosensor device according to this embodiment. As shown in FIG. 13, in the semiconductor photosensor device according to this embodiment, all of the current amplifiers 112, 114, and 116 are connected to the power supply terminal VCC. However, the first stage current amplifier 112 is connected to the normal ground terminal GND, whereas the second and subsequent stage current amplifiers 114 and 116 are connected to the standby terminal STBY.

FIG. 14A to FIG. 14E are diagrams showing operation waveforms of the semiconductor photosensor device shown in FIG. 13. As shown in FIG. 14A, a power supply voltage is constantly supplied to the power supply terminal VCC. However, as shown in FIG. 14B, a power supply voltage is supplied to the standby terminal STBY when the portable terminal unit is in the standby state, and when the key operation of the portable terminal unit is performed and thereby the portable terminal unit shifts from the standby state to the operating state, the supply of the power supply voltage to the standby terminal STBY is stopped only for a predetermined period of time. Incidentally, although the power supply voltage is supplied to the standby terminal STBY in the standby state in this embodiment, the power supply voltage may be supplied to the standby terminal STBY in an open state. Namely, the condition that a ground potential is supplied to the standby terminal STBY in the operating state is provided.

After the predetermined period of time, the output current from the semiconductor photosensor device is read (See FIG. 14C), and the supply of the power supply voltage to the standby terminal STBY is started again. Namely, the supply of the power supply voltage to the standby terminal STBY is stopped only for the predetermined period of time after the key operation of the portable terminal unit is performed.

The photodiode current arithmetic circuit 110 and the first stage current amplifier 112 operate regardless of whether the portable terminal unit is in the standby state or the operating state by a potential difference between the power supply voltage and a ground. The second and subsequent stage current amplifiers 114 and 116 do no operate in the standby state since there is no potential difference between the power supply voltage and the standby terminal STBY. Thus, as shown in FIG. 14D and FIG. 14E, current consumption and power consumption are kept low. However, the photodiode current arithmetic circuit 110 and the first stage current amplifier 112 are operating, whereby respective capacitances of these photodiode current arithmetic circuit 110 and the current amplifier 112 are being charged/discharged.

At a point in time when the necessity for the reading of the output current of the photodiode current arithmetic circuit 110 arises after the key operation of the portable terminal unit is performed, the voltage of the standby terminal STBY of the second and subsequent current amplifiers 114 and 116 drops, for example, to a ground level only for the predetermined period of time. At this time, a predetermined voltage is already supplied to the capacitances of the photodiodes PD1 and PD2 of the photodiode current arithmetic circuit 110, and the predetermined voltage is supplied to the respective parasitic capacitances of the current amplifier 112, whereby no transient change in current occurs in the respective parasitic capacitances in the photodiode current arithmetic circuit 110 and the current amplifier 112. Consequently, no charge/discharge time of the respective parasitic capacitances of the photodiode current arithmetic circuit 110 and the current amplifier 112 occurs, which results in a great reduction in the time required until the output current of the semiconductor photosensor device is stabilized even at low illumination.

Then, after the predetermined period of time, the supply of the power supply voltage to the standby terminal STBY is started again. Therefore, the difference between the power supply voltage supplied to the power supply terminal VCC and the power supply voltage supplied to the standby terminal STBY is eliminated, so that the second and subsequent current amplifiers 114 and 116 are brought into a no-operating state. Consequently, power consumption of the semiconductor photosensor device in the standby state can be reduced.

It should be mentioned that the present invention is not limited to the aforementioned embodiments, and various changes may be made therein. For example, the relation between voltages supplied to the respective terminals in the aforementioned embodiments is nothing but an example, and other voltages capable of realizing the same operation can be used. For example, in FIG. 7, the power supply voltage supplied to the power supply terminal VCC and the power supply voltage supplied to the standby terminal STBY may be the same voltage or different voltages. Moreover, a voltage line connected to the photodiode current arithmetic circuit 110 and a voltage line connected to the first stage current amplifier 112 may be formed separately so that different voltages are supplied. Further, the voltage supplied to the ground terminal GND is not limited to the ground potential and has only to be a voltage lower than the voltages supplied to the power supply terminal VCC and the standby terminal STBY.

Similarly, in FIG. 13, voltages supplied to the photodiode current arithmetic circuit 110 and the current amplifiers 112, 114, and 116 may be the same voltage or different voltages. Moreover, voltages supplied from the ground terminal to the photodiode current arithmetic circuit 110 and the first stage current amplifier 112 may be also the same voltage or different voltages. This applies to voltages supplied to the current amplifier 114 and the current amplifier 116.

Furthermore, in the aforementioned embodiments, the standby state is defined as the state in which the portable terminal unit is powered on but neither key operation nor phone call is performed, and the operating state is defined as the state in which the user is performing the key operation of the portable terminal unit or making a phone call, but definitions of these two states are not limited to the above.

What is claimed is:

1. A semiconductor photosensor device which outputs a detection result when a trigger signal is inputted, comprising:
    a photodiode current arithmetic circuit which is in an operating state regardless of whether before or after the input of the trigger signal, and which outputs a photocurrent generated by light irradiation;
    a first amplifier which is in an operating state regardless of whether before or after the input of the trigger signal, and which amplifies and outputs the output of the photodiode current arithmetic circuit; and
    a second amplifier which is in a non-operating state before the input of the trigger signal, wherein the second amplifier shifts to an operating state upon receiving the trigger signal, and amplifies and outputs the output of the first amplifier, wherein a power supply voltage is not supplied to the second amplifier before receiving the trigger signal, but the power supply voltage is supplied to the second amplifier upon receiving the trigger signal.

2. The semiconductor photosensor device according to claim 1, wherein
    a first power supply voltage is supplied to the photodiode current arithmetic circuit regardless of whether before or after the input of the trigger signal,
    a second power supply voltage is supplied to the first amplifier regardless of whether before or after the input of the trigger signal, and
    a third power supply voltage is supplied to the second amplifier upon receiving the trigger signal.

3. The semiconductor photosensor device according to claim 2, wherein the first power supply voltage and the second power supply voltage are the same voltage.

4. The semiconductor photosensor device according to claim 2, wherein the first power supply voltage, the second power supply voltage, and the third power supply voltage are the same voltage.

5. The semiconductor photosensor device according to claim 1, wherein
    a first power supply potential and a second power supply potential are supplied to the photodiode current arithmetic circuit regardless of whether before or after the input of the trigger signal,
    the first power supply potential and a third power supply potential are supplied to the first amplifier regardless of whether before or after the input of the trigger signal, and
    the first power supply potential is supplied to the second amplifier regardless of before or after the input of the trigger signal and a fourth power supply potential is supplied thereto upon receiving the trigger signal.

6. The semiconductor photosensor device according to claim 5, wherein the first power supply potential is a ground potential.

7. The semiconductor photosensor device according to claim 5, wherein the first power supply potential is a positive potential, and the second power supply potential is a ground potential.

8. The semiconductor photosensor device according to claim 7, wherein the third power supply potential is the ground potential.

9. The semiconductor photosensor device according claim 8, wherein the fourth power supply potential is the ground potential.

10. The semiconductor photosensor device according to claim 1, wherein
a first power supply potential is supplied to the photodiode current arithmetic circuit, the first amplifier, and the second amplifier, respectively,
the photodiode current arithmetic circuit and the first amplifier are connected to a first terminal to which a second power supply potential is supplied regardless of whether before or after the input of the trigger signal, and
the second amplifier is connected to the first terminal via a switching circuit.

11. The semiconductor photosensor device according to claim 10, wherein the switching circuit switches an ON state upon receiving the trigger signal.

12. The semiconductor photosensor device according to claim 11, wherein the first power supply potential is a ground potential.

13. The semiconductor photosensor device according to claim 1, wherein
a first power supply potential is supplied to the photodiode current arithmetic circuit, the first amplifier, and the second amplifier, respectively,
the photodiode current arithmetic circuit and the first amplifier are connected to a first terminal to which a second power supply potential is supplied regardless of whether before or after the input of the trigger signal,
the second amplifier is connected to a second terminal to which a third power supply potential is supplied upon receiving the trigger signal, and
a current which flows from the second terminal into the second amplifier is used as an output current of the semiconductor photosensor device.

14. The semiconductor photosensor device according to claim 13, wherein the third power supply potential is supplied to the second terminal via a resistance.

15. The semiconductor photosensor device according to claim 13, wherein the first power supply potential is a ground potential.

16. The semiconductor photosensor device according to claim 1, wherein the trigger signal is an electric signal which is generated by an operation of a user.

17. A portable terminal unit, comprising:
a trigger generator which generates a trigger signal based on an operation from outside of the trigger generator; and
a semiconductor photosensor device which outputs a detection result when the trigger signal is inputted, wherein
the semiconductor photosensor device comprises:
a photodiode current arithmetic circuit which is in an operating state regardless of whether before or after the input of the trigger signal, and which outputs a photocurrent generated by light irradiation;
a first amplifier which is in an operating state regardless of whether before or after the input of the trigger signal, and which amplifies and outputs the output of the photodiode current arithmetic circuit; and
a second amplifier which shifts to an operating state upon receiving the trigger signal, and which amplifies and outputs the output of the first amplifier, wherein a power supply voltage is not supplied to the second amplifier before receiving the trigger signal, but the power supply voltage is supplied to the second amplifier upon receiving the trigger signal.

18. The portable terminal unit according to claim 17, further comprising:
a light emitting element whose brightness is adjusted according to the detection result.

19. The portable terminal unit according to claim 17, further comprising a key operation section, wherein the trigger signal is generated by the key operation section being operated from the outside.

20. The portable terminal unit according to claim 17, further comprising:
a main body including a key operation section; and
a cover which brings the key operation section to a state capable of being operated from outside by being opened, wherein the trigger signal is generated by the cover being opened.

21. The semiconductor photosensor device according to claim 17, wherein the trigger signal is an electric signal which is generated by an operation of a user.

22. A semiconductor photosensor device which outputs a detection result when a trigger signal is inputted, comprising:
a photodiode current arithmetic circuit which is in an operating state regardless of whether before or after the input of the trigger signal, and which outputs a photocurrent generated by light irradiation;
a first amplifier which is in an operating state regardless of whether before or after the input of the trigger signal, and which amplifies and outputs the output of the photodiode current arithmetic circuit; and
a second amplifier which is in a non-operating state before the input of the trigger signal, wherein the second amplifier shifts to an operating state upon receiving the trigger signal, and amplifies and outputs the output of the first amplifier,
wherein a first power supply voltage is supplied to the photodiode current arithmetic circuit regardless of whether before or after the input of the trigger signal,
a second power supply voltage is supplied to the first amplifier regardless of whether before or after the input of the trigger signal, and
a third power supply voltage is supplied to the second amplifier upon receiving the trigger signal.

23. The semiconductor photosensor device according to claim 22, wherein the first power supply voltage and the second power supply voltage are the same voltage.

* * * * *